United States Patent [19]

Abell et al.

[11] 4,323,925
[45] Apr. 6, 1982

[54] METHOD AND APPARATUS FOR ARRAYING IMAGE SENSOR MODULES

[75] Inventors: Gurdon R. Abell, West Woodstock, Conn.; Francis J. Cook, Topsfield; Peter D. Howes, Sudbury, both of Mass.

[73] Assignee: Avco Everett Research Laboratory, Inc., Everett, Mass.

[21] Appl. No.: 166,922

[22] Filed: Jul. 7, 1980

[51] Int. Cl.³ .................. H04N 3/15; H01L 27/14
[52] U.S. Cl. .................................... 358/213; 357/24; 358/225; 313/376
[58] Field of Search .......... 358/212, 213, 225, 901, 358/55, 211, 293, 209; 250/209, 208, 578, 227, 332, 211 J, 213 R, 333; 350/96.24, 96.25, 169; 357/24, 30; 356/71; 313/373, 374, 376, 377, 379

[56] References Cited

U.S. PATENT DOCUMENTS

| | | | |
|---|---|---|---|
| 3,110,816 | 11/1963 | Kaisler et al. | 250/227 |
| 3,448,276 | 6/1969 | Witte | 250/227 |
| 3,609,367 | 9/1971 | Barron | 250/227 |
| 4,044,384 | 8/1977 | Inokuchi | 358/293 |

OTHER PUBLICATIONS

Williamson, "Cone Channel Condenser Optics", *Journal of the Optical Society of America*, vol. 42, No. 10, Oct. 1952, pp. 712–715.
Optical Channel Waveguide Arrays Coupled to Integrated Charge-Coupled Devices and Their Applications, J. T. Boyd and D. A. Ramey, University of Cincinnati, AFOSR-TR-79-1124.
Optical System with Fiber-Optical Elements, R. Y. Wong and M. R. Jafarpour, SPIE vol. 183, Space Optics (1979), pp. 218–222.
A New Plateau in Channeltron® Electron Multiplier Arrays-Characteristics, Construction and Application to Imaging Devices, L. D. Owen et al., Bendix Corporation, Electro-Optics Division, 1971, Ann Arbor, Mich.
Photoelectricity and Its Application, V. K. Zworykin and E. G. Ramberg, John Wiley, New York, pp. 155–174 (Ch. 9).

*Primary Examiner*—John C. Martin
*Attorney, Agent, or Firm*—M. E. Frederick; G. R. Abell

[57] ABSTRACT

An image sensor, suitable for resolving a high-resolution image, comprises an arrayed plurality of image sensor modules of moderate individual resolution. The high-resolution image is subdivided into contiguous sub-images, each of which is minified before being projected upon an image sensor module. This avoids bars of blindness between the fields of view of the image sensor modules, and also facilitates production and repair of the image sensor.

30 Claims, 7 Drawing Figures

_Fig 5_

_Fig 6_

METHOD AND APPARATUS FOR ARRAYING IMAGE SENSOR MODULES

BACKGROUND OF THE INVENTION

1. Field of the Invention

This invention relates to electrical-output optical image sensors, and particularly to efficient sensors having high imaging resolution, suitable for resolving views subtending several thousand picture elements in each direction.

2. Prior Art Problem

Until recently, it did not appear feasible to make an electrical-output optical image sensor having preferably very high imaging resolution, as would be required for purposes of remote sensing, mapping, surveillance and tracking, and also having very good quantum efficiency, as would also be preferred for such purposes. There were some high resolution television camera tubes of the "Vidicon" type, developed for such purposes as reproduction of drawings and documents, which could provide excellent imaging resolution but which had very poor quantum efficiency. Conversely, there were sensitive and efficient television camera tubes of other types, but these lacked the desired high imaging resolution. There have recently been developed several solid-state discrete-element electro-optical image sensors which are very compact and have good quantum efficiency, but have only modest imaging resolution, for designs having a tolerable production yield. In addition, these devices are small, light, rugged, long-lived and able to operate using only small amounts of power; these characteristics are very attractive. Recently, therefore, there has been a considerable effort to achieve the desired combination of high total imaging resolution and good quantum efficiency by arraying considerable numbers of such solid-state electro-optical sensors as modules in the focal plane of optical instruments, to add their individual imaging resolutions while retaining their quantum efficiency.

Provision of such a focal plane array presents a design dilemma: first, it is difficult, and probably impractical to produce a solid-state electro-optical image sensor module in which the imaging capability extends all the way to the physical lateral boundaries of the device, due to requirements for space for support and electrical connections, and because of dimensional constraints on the scribing and separating of the module from its parent wafer or substrate. Second, it is difficult to devise a modular array which can be reliably assembled and readily repaired, as required for a high probability of manufacturing yield, unless a reasonable fraction of the periphery of each module is available for mechanical bonds and electrical connections and interconnections. And third, it is undesirable, in many applications, that the total field of view of the sensor array be broken up into an array of non-contiguous fields of view of the individual imaging sensor modules, separated by bars of blindness representing the image-insensitive peripheries of the individual modules and the regions dedicated to bonds, connections and interconnections. It is clear that alleviation of any one of these difficulties, in a direct sense, leads to exacerbation of the other two. It is also clear that thus arraying other kinds of electro-optical imaging sensors, such as television camera tubes, would present essentially the same design dilemma, since their imaging capabilities also do not extend to the lateral boundaries of their envelopes.

SUMMARY OF THE INVENTION

It is therefore the principal object of this invention to provide a method and apparatus for arraying a plurality of image sensor modules so that their individual imaging resolutions may be combined to provide high total imaging resolution, while avoiding bars of blindness between fields of view of the individual image sensor modules. It is a further object of this invention to provide for arraying such modules so that production and repair of the arrays is facilitated.

According to this invention, the intended objects are attained by subdividing a high-resolution optical image into an arrayed plurality of contiguous optical sub-images bearing light energy, and projecting energy from each of these sub-images in geometrically reduced form upon the flux-sensitive image-input surface of a corresponding one of an arrayed plurality of electrical-output image sensor modules. Since the flux-sensitive image-input surfaces of the image sensor modules may thus be smaller than the optical sub-images, they are not necessarily contiguous and the gaps between them may be occupied by non-imaging peripheral structure such as mechanical or electrical connections, without creating bars of blindness.

Further, according to this invention, such modular construction permits assembly of a high-resolution sensor from pre-tested modules, and also permits removal and replacement of modules which fail during assembly or use; these features facilitate practical attainment of the goal of efficient high-resolution imaging.

DESCRIPTION OF THE INVENTION

Figure 1:
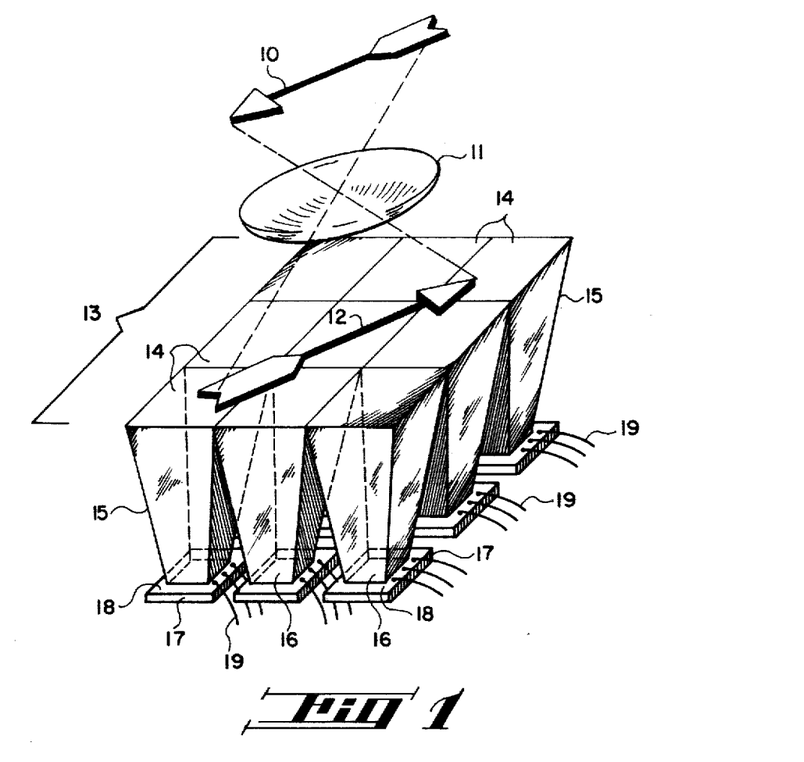
FIG. 1 is a schematic perspective view illustrating this invention in basic and generic form.

Reference is made to FIG. 1, which is a schematic perspective view illustrating this invention in basic and generic form. An optical object, symbolized conventionally by arrow 10, is projected by optical means, such as lens 11, to form a high-resolution optical image, symbolized conventionally by arrow 12, lying upon an image surface 13. According to the conventional arrow symbolism, object 10 and image 12 are to be understood as being extensive, and image 12 may cover all of surface 13. High-resolution optical image 12 is subdivided into an arrayed plurality of contiguous optical sub-images 14, lying upon image surface 13, here shown as nine in number for purposes of illustration. A portion of the image-bearing energy of each optical sub-image 14 passes through image surface 13 as a sub-image-bearing flux which is transmitted in image-coherent geometrically reduced form by one of an arrayed plurality of minifying means, here symbolized by pyramidal frustra 15, to yield minified image-coherent geometrically reduced image-bearing flux upon and in register with flux-sensitive image-input surfaces 16 borne by flux-sensitive electrical-output image sensor modules 17. In general, each module 17 may have a flux-insensitive or non-imaging peripheral region 18, for such purposes as mechanical or electrical connection, and electrical leads 19. As used herein, the term "flux" denotes any form of energy which can be projected to form an image, and includes not only photons, such as visible light, but also accelerated electrons.

While optical sub-images 14 upon image surface 13 are contiguous, in order to avoid bars of blindness in high-resolution image 12, flux-sensitive image-input surfaces 16 are not necessarily contiguous, due to the invervening minification. Thereby, space is made available for regions such as 18, without introducing bars of blindness. Specific embodiments of the above-described generic form will now be described.

Figure 2:
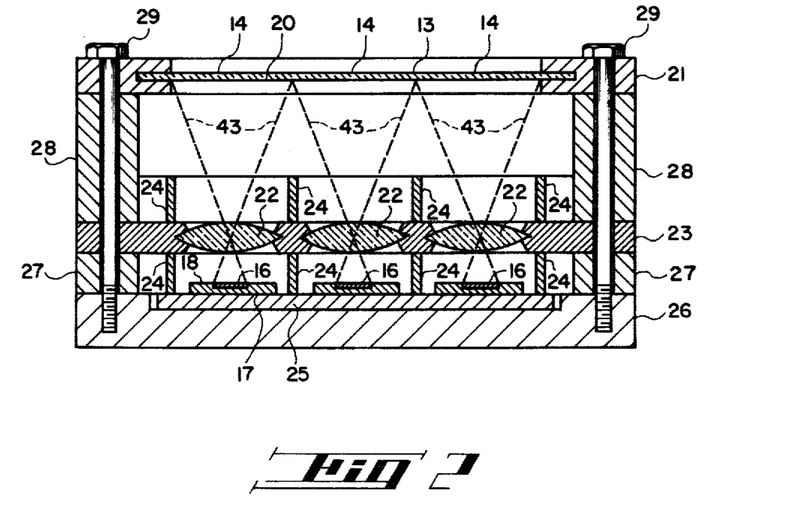
FIG. 2 is a schematic view, in cross section, of a first simple optical embodiment of this invention utilizing arrayed optical lenses.

Reference is now made to FIG. 2 which is a schematic view, in cross section, of a first simple optical embodiment of this invention. In this embodiment, the arrayed plurality of minifying means, previously symbolized in FIG. 1 as pyramidal frustra 15, comprises arrayed optical lenses 22. Image surface 13 lies upon an image surface element 20 of thin optically translucent or light-diffusing material, such as a ground surface upon glass, which is fixed in position by screen carrier 21. A portion of the light energy from each contiguous optical sub-image 14 is forward-scattered to provide an optical object for a corresponding optical lens 22 arrayed in a lens carrier 23. Each lens 22 focusses and projects its optical object in image-coherent geometrically-reduced form upon a minified sub-image surface in register with the flux-sensitive image-input surface 16 of a corresponding electrical-output image sensor module 17, which may typically be a solid-state discrete-element electro-optical scanner of the CCD, CID or BBD type, but may also be a conventional television camera tube.

It will be noted that the boundaries of optical sub-images 14 are here defined by the reversed optical projection of image-input surfaces 16 through corresponding lenses 22 upon image surface 13; it is therefore not necessary to make any other provision for subdividing high-resolution image 12. This relationship, together with the requirement to subdivide high-resolution image 12 with neither gaps nor large overlaps, determines the focal length and focal distances for lenses 22, as well as the spacing and alignment tolerances of the elements of the array. In many applications, it may be advantageous to subdivide the image so that the sub-images are exactly contiguous, with no overlap. In other applications, small overlaps, of the order of about one element of the electro-optical scanner, may advantageously permit combining electrical outputs from overlapped elements to provide a more seamless field of view. As a convenient term of reference, the term "contiguous" is used herein to denote either exactly contiguous or slightly overlapped juxtaposition of sub-images.

Blackened optical baffles 24 may be provided to prevent optical cross-talk or light leakage between adjacent elements of the array. Image sensor modules 17 are supported by support board 25 which also provides means (not shown) for fastening and making connections to modules 17. Support board 25 also supports any conventional ancillaries (not shown) such as video preamplifiers or multiplexers. Support board 25 is in turn supported by back plate 26, which is rigidly assembled to lens carrier 23 and screen carrier 21 by means of lower spacer walls 27 and upper spacer walls 28, fastened by bolts 29.

Figure 3:
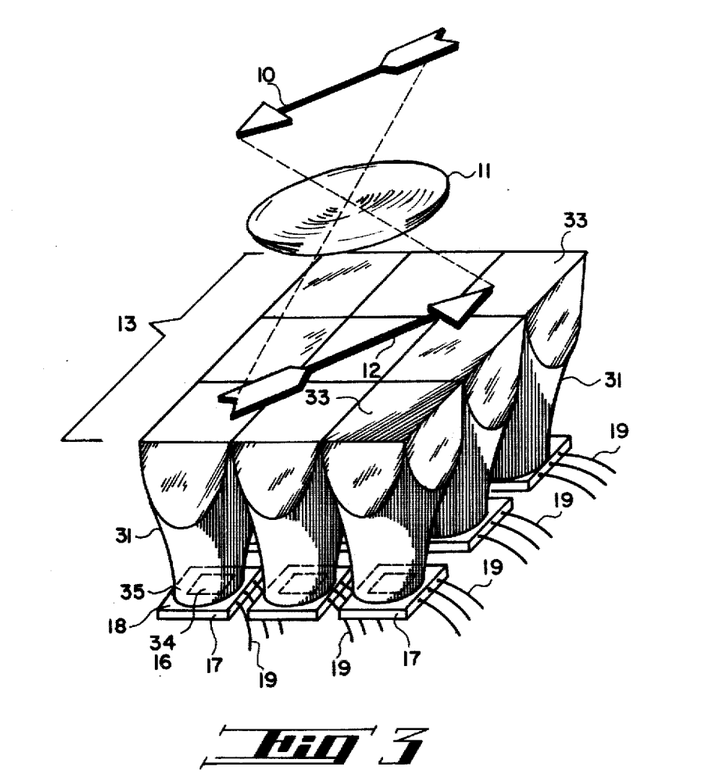
FIG. 3 is a schematic perspective view of a second simple optical embodiment of this invention utilizing arrayed tapered coherent fiber-optic bundle elements.

Reference is next made to FIG. 3, which is a schematic perspective view of a second simple optical embodiment of this invention. In this embodiment, the arrayed plurality of minifying means, previously symbolized in FIG. 1 as pyramidal frustra 15, comprises arrayed tapered coherent fiber-optic bundle elements 31. The larger ends of the bundles are cut down to form contiguous faces 33 which are in register with optical sub-images 14 and which together define image surface 13. A portion of the light energy from each optical sub-image 14 is transmitted through image surface 13 upon face 33 and is further transmitted in image-coherent form to emerge in geometrically reduced or minified form through a sub-image surface 34 upon smaller end 35 of fiber-optic bundle element 31. Again, each sub-image surface 34 is disposed in register with the flux-sensitive image-input surface 16 of an electrical-output image sensor module 17. Each image sensor module 17 may be supported by being cemented to smaller end 35 of its corresponding fiber-optic bundle element 31, using a suitable transparent optical cement.

Figure 4A:
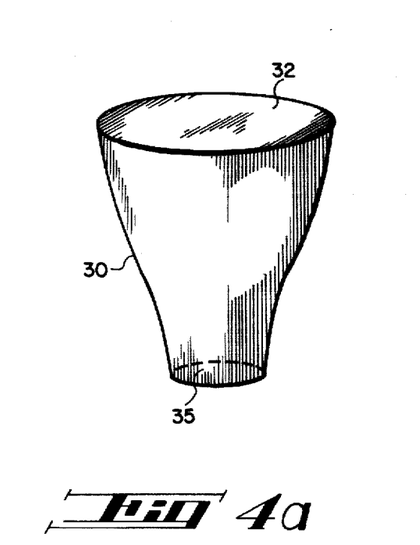
FIGS. 4a and 4b are perspective views respectively of a tapered coherent fiber-optic bundle and of a bundle element formed therefrom.
Figure 4B:
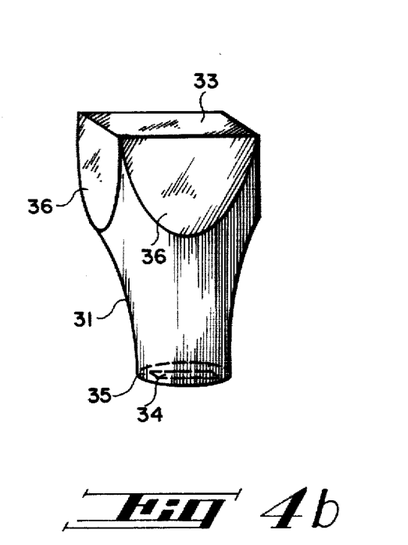

Reference is now made to FIGS. 4a and 4b which are perspective views respectively of a tapered coherent fiber-optic bundle and of a bundle element formed therefrom. The tapered coherent fiber-optic bundle 30 has a larger end 32 and a smaller end 35, and is typically made by heating a bar of coherent fiber-optic material at locations along its length, drawing it out so that it necks down at those locations and cutting it at successive locations of larger and smaller diameter. Thereby, optical fibers intersecting the larger end of each bundle are reduced in diameter to emerge in the same order at the smaller end of each bundle. Consequently, the tapered coherent fiber-optic bundle has the property that a light image projected upon larger end 32 follows the fibers and emerges in minified form upon smaller end 35.

Larger end 32 has facets 36 formed upon it to define face 33 which is of form and size required to be in register with sub-image 14. The facets 36 may be approximately normal to face 33, as shown, or may be somewhat convergent toward smaller end 35, provided that such convergence is no greater than that of the outer fibers in the bundle at the locations of facets 36; this assures that no imaging fibers are transected by the facets, between the two ends.

Sub-image surface 34 on smaller end 35 is simply the locus of fibers which pass through face 33, defined on the larger end. In order to make surface 34 of size that can be in register with image-input surface 16 of a sensor module 17, the following process may be employed: First, make bundle 30 slightly longer than is required to provide the requisite minification. Then form facets 36 to provide the proper size for face 33, with sufficient convergence to avoid mechanical interference between contiguous bundle elements. Then shine light upon face 33, minimizing that falling on facets 36, as by blackening them, and observe and measure the size of the resulting illumination sub-image surface 34, as with a filar microscope; in general it may be expected to be slightly too small. The size error, divided by the tangent of the outer-fiber convergence angle near the smaller end, defines the amount by which smaller end 35 should be shortened. It is prudent to remove slightly less, to remeasure sub-image surface 34, and then make a final correction.

Surfaces 33 and 34 have been shown as generally rectangular and normal to the axis of bundle 30. If image surface 13 is not planar, surfaces 33 will in general not be rectangular but may be trapezoidal or the like. In order to match such shapes to a rectangular sub-image surface 34 which may be in register with a typical rectangular image-input surface 16, one may form either or both of surfaces 33 and 34 at an angle other than normal to the axis of bundle 30. A simple way to obtain the requisite angles is to make a rough calculation based upon the differing magnifications needed at peripheral parts of face 33 and upon the fiber convergences at the two ends, and then use the cut-and-try scheme set forth above, applying it to angle as well as length.

In comparing the two simple optical embodiments of this invention shown in FIGS. 2 and 3, one may note that optical lenses 22 and light-diffusing surface element 20 may be considerably less expensive than tapered coherent fiber-optic bundle elements 31. But, on the other hand, bundle elements 31 among other things provide far more efficient transmission of image light energy than do lenses 22 and surface element 20. In any given application, preference for one or the other will depend upon the relative importance of cost and efficiency. For most of our present applications, we prefer the embodiment shown in FIG. 3.

The two previously-described embodiments of this invention employed optical image-coherent minification of light sub-images to achieve the required separation of the image-input surfaces of the arrayed image sensor modules; essentially the same objective can be achieved by image-coherent minification of other forms of sub-image-bearing flux such as accelerated electrons. Apparatus for this purpose will now be described with reference to FIG. 5 and FIG. 6 which are schematic views, respectively in cross section and in perspective, of a portion of a first electron-optical embodiment of this invention, in which the arrayed plurality of minifying means, previously symbolized in FIG. 1 as pyramidal frustra 15, comprises demagnifying or minifying electron-optical lenses.

In this embodiment, image surface 13 lies upon a semi-transparent photoemissive surface 40 carried on the inner surface of a transparent window 41 of an evacuated vessel in which the image sensor is disposed. A portion of the energy of each contiguous optical sub-image 14 is transformed into a corresponding sub-image-bearing flux of photoelectrons which is accelerated and focussed by a corresponding one of an array 42 of electron-optical lenses to impinge as a minified image of accelerated electrons upon the image-input surface 16 of a corresponding image sensor module 17. In this embodiment, each electrical-output image sensor module 17 is sensitive to a flux of accelerated electrons and may be a solid-state discrete-element electrically-scanned device of the CCD, CID or BBD type. Typical trajectories of focussed and accelerated electrons are indicated by dashed lines 43 in FIGS. 5 and 6. Image sensors modules 17 are supported by support board 25 which provides means (not shown) for fastening and making connections to modules 17. Support board 25 may also provide part of the structure of the evacuated vessel.

Figure 5:
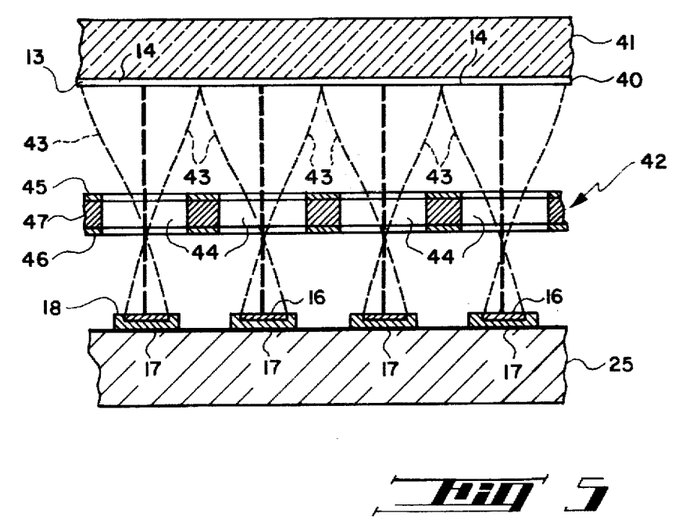
FIGS. 5 and 6 are schematic views, respectively, in cross section and in perspective, of a portion of a first electron-optical embodiment of this invention.
Figure 6:
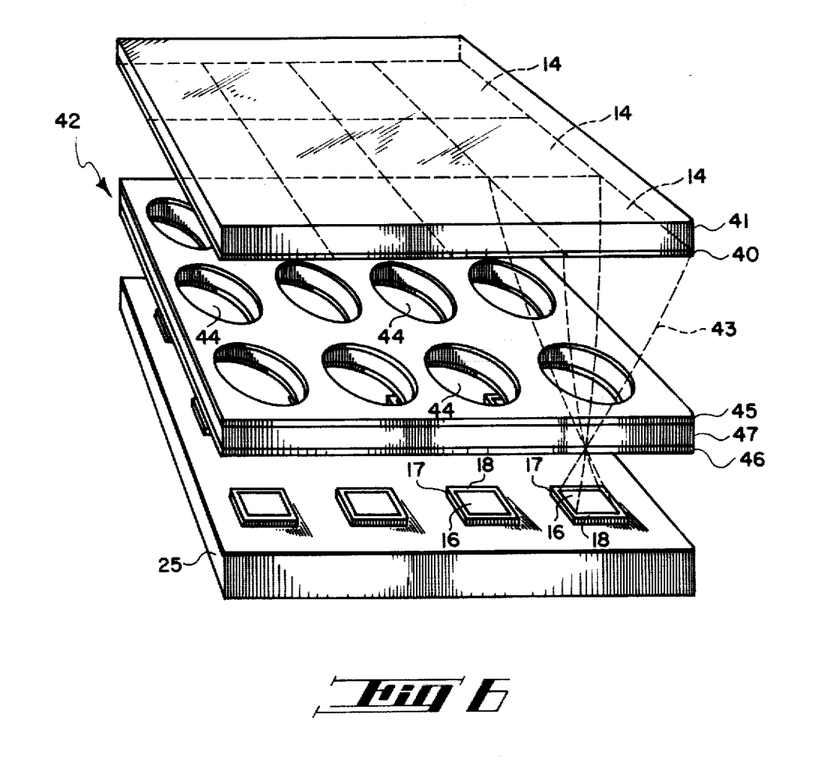

While the electron trajectories indicated by dashed lines 43 are drawn to define exactly contiguous optical sub-images 14, it may be advantageous in some applications to subdivide the image with small overlaps, similar to those described with respect to the embodiment illustrated in FIG. 2. Again, the term "contiguous" is used to denote either exactly contiguous or slightly overlapped juxtaposition of sub-images.

Electron lens array 42 may comprise an array of holes 44 in two sheets 45 and 46 of electrically conductive material separated by insulating material 47. Typically, this structure may be made by etching holes in a sheet of glass with thin layers of evaporated metal upon the two outer surfaces. Electrical leads (not shown) may be brought out to the exterior of the evacuated vessel to provide means for applying focussing and accelerating potentials to photoemissive surface 40, to electron lens sheets 45 and 46, and to the array of sensor modules 17. These potentials, together with the size and spacing of holes 44 and the spacings between photoemissive surface 40, sheets 45 and 46, and modules 17, may be used in conventional manner to determine the focussing conditions and degree of electron image minification, according to the well-known rules of electron optics. A particularly simple case is that in which sheet 45 has the same potential as photoemissive surface 40, sheet 46 has the same potential as the array of modules 17, and the spacing between sheets 45 and 46 is chosen to be relatively small: this is tantamount to an array of simple cylindrical image converters. From graphs and tables in standard works such as "Tabellen der Electronenphysik Ionenphysik and Mikroscopie" (M. von Ardenne, ed., Deutscher Verlag der Wissenschaften, Berlin, 1956) and "Electron Optics and the Electron Microscope" (V. K. Zworykin et al, John Wiley, New York, 1945), one finds that 2:1 minification may be achieved for a photocathode-to-lens spacing of about 0.95 hole diameters and a lens-to-module spacing of about 0.95 hole diameters, while a 3:1 minification may be achieved for a photocathode-to-lens spacing of about 1.05 hole diameters and a lens-to-module spacing of about 0.70 hole diameters. Variation of minification, while maintaining focus, may be attained by varying the potentials, on sheets 45 and 46, from those values.

Because of the presence of neighboring electron lenses, the potential distribution in each electron lens will not be strictly axisymmetric, resulting in an azimuthal variation of focal power. This can be largely compensated, for example, by making the holes slightly squarish, rather than exactly round. A simple empirical way to derive the proper hole shape for a given design, and all other important parameters and dimensions, is the technique of macromodelling, based upon the fact that pure electrostatic devices scale linearly. If desired, one may make a conveniently large scale model of just one electron lens, together with just to contiguous parts of nearest neighbors, out of suitable and convenient materials, simulate the input image and photoemissive surface with some photoemissive patterned structure such as a piece of yellow brass or galvanized screen illuminated by a UV lamp, simulate the input surface of the image sensor module with a phosphor screen upon which the electron image may be focussed and observed, place the whole model in a readily-demountable vacuum system, apply potentials and observe results. Changes in relative potentials, form and spacing may be made quickly, allowing rapid design optimization.

In comparing this electron-optical embodiment of this invention with the two simple optical embodiments shown in FIGS. 2 and 3, one may note that this embodiment entails the expense of a high-vacuum structure and a good photocathode, and the nuisance of having to provide high-voltage power. On the other hand, since each accelerated photoelectron can give rise to a large number of electron-hole pairs in an electron-sensitive image sensor module, this electron-optical embodiment can be made very sensitive. Therefore, use of this embodiment would be advantageous when the greatest possible sensitivity is needed.

The three previously-described embodiments of this invention illustrate diverse methods for subdividing a high-resolution optical image into an arrayed plurality of contiguous optical sub-images and projecting energy of each of these in minified form upon the image-input surface of an image sensor module, thus providing room for necessary and useful non-imaging peripheral structure without creating bars of blindness. The list of embodiments is not exhaustive, as may be understood from the following discussion.

In recent years, there has been developed so-called "micro-channel-plate" image-coherent electron multiplier material comprising a dense ordered array of fine holes penetrating a slab of glassy material. These holes are lined with a high-electrical-resistance material having a substantial secondary electron emission ratio. When a sufficient electrical potential is applied across the slab in a vacuum, an electron impinging upon the negative end of a hole will be drawn into it and ricochet through, knocking off more secondary electrons at each impact with the inner walls of the hole, emerging at the positive end of the hole as a considerable burst of electrons. Correspondingly, an electron image applied to the negative side of the slab will emerge from the positive side as a geometrically identical but greatly intensified electron image. This principle has been used in practical optical image intensifiers which combine such a micro-channel-plate slab closely adjacent, on its negative side, to a photosurface upon which an optical image is projected, and also closely adjacent, on its positive side, to a strongly positively charged phosphor surface upon which a strongly intensified optical image appears. Such image intensifiers are compact, rugged and reliable, and are very useful for viewing dimly-illuminated scenes.

The image-coherent electron multiplier material itself may be made by a process somewhat like that used to make image-coherent fiber-optic material. A group of a large number of suitably-coated generally glassy fibers is fused and drawn together to form a bar which is transversely cut into slabs, and then the center material of each fiber is etched or dissolved out to leave the holes. It appears that such material could be drawn into tapered image-coherent bars before being cut into somewhat elongated tapered slabs, and then the holes could be etched, resulting in tapered image-coherent micro-channel-plate electron image multiplier material.

Such material could be fashioned into minifying electron-multiplying image-coherent modules, somewhat resembling the tapered coherent fiber-optic bundle elements 31 shown in FIGS. 3 and 4b, which then could be arrayed closely adjacent, on their larger and negative side, to a photoemissive surface carried on the inner surface of a transparent window of an evacuated vessel in which an image sensor is disposed, somewhat resembling that in FIGS. 5 and 6. Closely adjacent to the smaller and positive side of each minifying module would be the positively-charged image-input surface 16 of a corresponding image sensor module 17 of the electron-sensitive kind used in the embodiment of FIGS. 5 and 6.

Such an embodiment of the invention, using tapered image-coherent micro-channel-plate electron image multiplier material for the image minifying function, could have very high sensitivity, comparable to that of the embodiment shown in FIGS. 5 and 6. However, there is a limitation which must be kept in mind: for a reasonable dynamic range of intensities, the length-to-diameter ratio of a micro-channel hole must not be very large; conversely, for good resolution with a reasonably long minifying module, that ratio could become quite large. So the micro-channel approach could result in a trade-off between dynamic range and resolution.

As shown and described with respect to FIG. 1, and as indicated also in FIGS. 2, 3, 5, and 6, each image sensor module 17 may have a flux-insensitive or non-imaging peripheral region 18, adjacent to flux-sensitive image-input surface 16, for such purposes as mechanical or electrical connection. From inspection of the Figures, it is clear that there may be additional room between modules 17 for making connections to supporting structure such as support boards 25. This space between image-input surfaces 16 is doubly advantageous: not only does it permit ready assembly and connection of the modules with their support, but equally importantly, it permits removal and replacement of a module which proves defective after assembly, without danger of destroying the whole assembly. These capabilities, in the context of being able to use pre-tested image sensor modules, permit the attainment of high resolution with acceptably high manufacturing yield of operable devices. This advantage of the invention is in addition to the advantage of avoiding bars of blindness between the fields of view of the individual image sensor modules.

Given the foregoing teaching, those skilled in the art to which this invention pertains may readily devise further or extended embodiments. For one example, while the electron-optical embodiment, shown and described with respect to FIGS. 5 and 6, uses pure electrostatic electron-optical lenses to perform the image-coherent minification, it is clear that one could employ electron-optical lenses which are, at least in part, of the magnetic type. For another example, while description of the device has been in terms of sensing an optical image, it is clear that operation is not confined to just the visible region of the light spectrum. Indeed, an embodiment according to FIGS. 2 or 3, using suitable glass and a silicon sensor module, may be found to be sensitive over a spectral range from the near ultraviolet to about 0.9 micrometers in the near infrared. With suitable materials, embodiments of this invention can be designed to operate in still other regions of the light spectrum. It is an unexpected and not obvious feature of this invention that, in all of the described embodiments, the directions of the paths, followed by the sub-image-bearing flux which is being minified, are largely independent of the directions of arrival of the rays of light which form the high-resolution optical image.

The various features and advantages of the invention are thought to be clear from the foregoing description. Various other features and advantages not specifically enumerated will undoubtedly occur to those versed in the art, as likewise many variations and modifications of the embodiments which have been illustrated, all of which may be achieved without departing from the spirit and scope of the invention as defined by the following claims.

We claim:

1. An electrical-output optical image sensor for a two-dimensional optical image composed of an arrayed plurality of contiguous two-dimensional optical sub-images bearing light energy, said sensor comprising:

an image surface for receiving said two-dimensional optical image and transmitting a portion of the light energy of each said two-dimensional optical sub-image as a corresponding two-dimensional sub-image-bearing flux;

an arrayed plurality of minifying means including two-dimensional minified sub-image surfaces and corresponding in number and arrangement to said plurality of contiguous two-dimensional optical sub-images, said minifying means receiving and transmitting each said two-dimensional sub-image-bearing flux in image-coherent geometrically reduced form as a corresponding two-dimensional minified sub-image-bearing flux incident upon and through a corresponding said two-dimensional minified sub-image surface; and arrayed flux-sensitive electrical-output image sensor modules, each having a flux-sensitive two-dimensional image-input surface in register with a corresponding two-dimensional minified sub-image surface and receiving a corresponding two-dimensional minified sub-image-bearing flux, and having electrical means for converting said two-dimensional minified sub-image-bearing flux into a corresponding pattern of electrical signals.

2. An electrical-output image sensor according to claim 1 wherein:

said image surface is a light-diffusing surface transmitting a portion of the light energy of each two-dimensional optical sub-image as a two-dimensional sub-image-bearing light flux constituting a corresponding two-dimensional optical object located at said image surface;

said arrayed plurality of minifying means comprises an array of optical lenses imaging each said two-dimensional optical object in image-coherent geometrically reduced form upon and through a corresponding minified sub-image surface; and said flux-sensitive electrical-output image sensor modules are light-sensitive image sensor modules.

3. An electrical-output optical image sensor according to claim 1 wherein:

said arrayed plurality of minifying means comprises optically minifying image-coherent fiber-optic modules, each such module being made from image-coherent fiber-optic bundle material having a larger optical input end and a smaller optical output end, each such module having formed, on said larger end, an optical input surface image-coherently connected by optical fibers of said bundle material to said smaller end to define image-coherently thereon an optical output surface smaller than said optical input surface;

said image surface lies upon the arrayed and contiguous optical input surfaces of an arrayed plurality of optically minifying image-coherent fiber-optic modules, each said optical input surface transmitting a portion of the light energy of a two-dimensional optical sub-image as a corresponding two-dimensional sub-image-bearing light flux;

each said optically minifying image-coherent fiber-optic module has its optical input surface in register with a corresponding one two-dimensional optical sub-image, and has its optical output surface in register with a corresponding minified sub-image surface; and said flux-sensitive electrical-output image sensor modules are light-sensitive image sensor modules.

4. An electrical-output optical image sensor according to claim 1 wherein:

said electrical-output optical image sensor is disposed in a vacuum contained in an evacuated vessel having an optically transparent window through which said optical image enters;

said image surface lies upon a photoemissive surface transmitting a portion of the light energy of each optical sub-image as a corresponding sub-image-bearing flux of photoelectrons;

said arrayed minifying means comprises an array of electrostatic electron-optical lenses focussing and accelerating each said sub-image-bearing flux of photoelectrons in image-coherent geometrically-reduced form as a minified sub-image-bearing accelerated electron flux upon and through a corresponding minified electron sub-image surface;

said flux-sensitive electrical-output image sensor modules are sensitive to accelerated electrons; and said photoemissive surface, said array of electrostatic electron-optical lenses and said flux sensitive electrical-output image sensor modules are adapted to be provided with electron focussing and accelerating potentials.

5. An electrical-output optical image sensor according to claim 1 wherein:

said electrical-output optical image sensor is disposed in a vacuum contained in an evacuated vessel having an optically transparent window through which said optical image enters;

said image surface lies upon a photoemissive surface transmitting a portion of the light energy of each optical sub-image as a corresponding sub-image-bearing flux of photoelectrons;

said arrayed minifying means comprises an array of minifying electron-multiplying image-coherent modules for minifying, accelerating and multiplying each said flux of photoelectrons, each said image-coherent module being made from tapered image-coherent micro-channel-plate electron image multiplier material having a larger input end and a smaller output end, each image-coherent module having formed on its larger end an electron input surface closely adjacent to said photoemissive surface and congruent to and in register with a corresponding optical sub-image and its sub-image-bearing flux of photoelectrons, and each image-coherent module having on its smaller end a corresponding electron output surface bearing a minified sub-image surface emitting a corresponding minified sub-image-bearing flux of accelerated electrons;

said flux-sensitive electrical-output image sensor modules are sensitive to accelerated electrons; and said photoemissive surface, said minifying electron-multiplying image-coherent modules and said flux-sensitive image sensor modules are adapted to be provided with electron accelerating potentials.

6. An electrical-output optical image sensor according to claim 1 wherein:

each said flux-sensitive image sensor module has, contiguous to said flux-sensitive image-input surface, a non-imaging area adapted to purposes other than receiving said minified sub-image-bearing flux.

7. An electrical-output optical image sensor according to claims 2 or 3 wherein:
   each said light-sensitive image sensor module is a television camera tube with associated electrical focussing and scanning means; and
   said flux-sensitive image-input surface is the scanned portion of the face of said television camera tube.

8. An electrical-output optical image sensor according to claims 2 or 3 wherein:
   each said light-sensitive image sensor module is a solid-state discrete-element sensor having an array of electrically scannable light-sensitive elements occupying a portion of a substrate; and
   said flux-sensitive image-input surface is said portion of said substrate occupied by said array of electrically scannable light-sensitive elements.

9. An electrical-output optical image sensor according to claims 4 or 5 wherein:
   each said flux-sensitive image sensor module, sensitive to accelerated electrons, is a solid-state discrete-element sensor having an array of electrically scannable elements, sensitive to accelerated electrons, occupying a portion of a substrate; and
   said flux-sensitive image-input surface is said portion of said substrate occupied by said array of electrically scannable elements sensitive to accelerated electrons.

10. An electrical-output optical image sensor according to 3 or 5 wherein:
    said input surface, formed upon said larger end, is adjusted in position and angle upon said larger end to be congruent to and in registry with said optical sub-image; and
    said output surface, formed upon said smaller end, is adjusted in position and angle upon said smaller end to be congruent to and in registry with said flux-sensitive image-input surface.

11. An optical image sensor for converting a two-dimensional optical image to electric signals, comprising:
    means for receiving said two-dimensional optical image in the form of a plurality of contiguous two-dimensional sub-images and transmitting each said two-dimensional sub-image in image-coherent minified form to a two-dimensional minified sub-image surface; and
    a plurality of image sensor means for converting a two-dimensional optical image into a corresponding pattern of electrical signals, each said sensor means having a two-dimensional image input surface for receiving a different one of said two-dimensional sub-images at said two-dimensional minified sub-image surface and converting said two-dimensional sub-image into a corresponding pattern of electrical signals.

12. An optical image sensor according to claim 11 wherein:
    said means for receiving said optical image comprises a light-scattering surface upon which said optical image is received and further comprises a plurality of optical lenses transmitting each said sub-image.

13. An optical image sensor according to claim 12 wherein:
    said contiguous sub-images are defined upon said light-scattering surface by geometrical projection, of said image input surface, through said optical lenses, upon said light-scattering surface.

14. An optical image sensor according to claim 11 wherein:
    said means for receiving said optical image comprises optically minifying image-coherent fiber-optic modules, each such module being made from tapered image-coherent fiber-optic bundle material having a larger end and a smaller end; each such module having formed, on said larger end, an optical input surface coherently connected by optical fibers of said bundle material to said smaller end to define thereon an optical output surface smaller than said optical input surface;
    said optical input surfaces are contiguous, and said optical image lies upon said contiguous surfaces which define said contiguous sub-images; and
    each said optical output surface is in register with a corresponding minified sub-image surface.

15. An optical image sensor according to claim 11 wherein:
    said image sensor means, for converting an optical image into a corresponding pattern of electrical signals, comprises a solid-state discrete-element sensor.

16. An optical image sensor for converting an optical image to electrical signals, comprising:
    photoemissive means for converting said optical image to a corresponding image-bearing flux of photoelectrons;
    electron-optical means for receiving said image-bearing flux of photoelectrons in the form of contiguous sub-image-bearing fluxes and transmitting each said sub-image-bearing flux in image-coherent minified form to a minified sub-image surface; and
    a plurality of image sensor means for converting an image-bearing flux into a corresponding pattern of electrical signals, each said sensor means having an image input surface for receiving a different one of said sub-image-bearing fluxes at said minified sub-image surface and converting said sub-image-bearing flux into a corresponding pattern of electrical signals.

17. An optical image sensor according to claim 16 wherein:
    said electron-optical means comprises a plurality of electron-optical lenses.

18. An optical image sensor according to claim 16 wherein:
    said electron-optical means comprises a plurality of electron-multiplying image-coherent modules made from tapered micro-channel-plate electron image multiplier material.

19. An optical image sensor according to claim 16 wherein:
    said image sensor means, for converting an optical image into a corresponding pattern of electrical signals, comprises a solid-state discrete-element sensor.

20. An optical image sensor according to claim 11 or 16 and further comprising:
    optical projection means for projecting and focussing an optical object to provide said optical image.

21. An electrical-output sensor for a two-dimensional optical image comprising:
    an arrayed plurality of image-minifying tapered fiber-optics bundle elements, each having a two-dimensional face formed on one end image-coherently and fiber-optically connected to a smaller two-dimensional sub-image surface on the other end, said element faces being arrayed contiguously to provide an image surface upon which said optical image is received; and a corresponding plurality of electrical-output optical image sensor modules, each having a light-sensitive two-dimensional image-input surface abutting and in register with said two-dimensional sub-image surface of a corresponding one bundle element.

22. An electrical-output sensor for an optical image according to claim 21 wherein:
said image sensor module is fastened to said bundle element with transparent cement.

23. An electrical-output sensor for an optical image according to claim 21 wherein:
said image sensor module is a solid-state discrete-element electro-optical scanner.

24. A method for combining the optical imaging resolution of a plurality of electrical-output image sensor modules to resolve a high-resolution two-dimensional optical image, said method comprising the steps of:
projecting the high-resolution two-dimensional optical image onto an image surface, said image comprising an arrayed plurality of contiguous two-dimensional optical sub-images bearing light energy;
transmitting a portion of the energy of each said two-dimensional optical sub-image, through said image surface, as a corresponding two-dimensional sub-image-bearing flux;
providing from each said two-dimensional sub-image-bearing flux, image-coherent geometrically minified two-dimensional subimage-bearing flux; and
applying each said minified two-dimensional sub-image-bearing flux to an electrical-output image sensor module.

25. A method for combining the optical imaging resolution of a plurality of electrical-output image sensor modules according to claim 24 wherein:
said image surface lies upon a light-diffusing surface;
said sub-image-bearing flux comprises photons;
said providing, of said image-coherent geometrically minified sub-image-bearing flux, is accomplished by projecting said sub-image-bearing flux through minifying optical lens means; and
said electrical-output image sensor modules are sensitive to photons.

26. A method for combining the optical imaging resolution of a plurality of electrical-output image sensor modules according to claim 24 wherein:
said image surface lies upon contiguous optical input surfaces of optically minifying image-coherent fiber optic modules, each said module having an optical input surface;
said sub-image-bearing flux comprises photons;
said providing, of said image-coherent geometrically minified sub-image-bearing flux, is accomplished by applying said sub-image-bearing flux to said optical input surface and transmitting said flux through said minifying fiber-optic module; and
said electrical-output image sensor modules are sensitive to photons.

27. The method for combining the optical imaging resolution of a plurality of electrical-output image sensor modules according to claim 24 wherein:
said image surface lies upon a photoemissive surface disposed in a vacuum;
said sub-image-bearing flux comprises photoelectrons;
said providing, of said image-coherent geometrically minified sub-image-bearing flux, is accomplished by projecting and accelerating said photoelectrons through minifying electron-optical lens means disposed in said vacuum; and
said electrical-output image sensor modules are sensitive to accelerated photoelectrons.

28. A method for combining the optical imaging resolution of a plurality of electrical-output image sensor modules according to claim 24 wherein:
said image surface lies upon a photoemissive surface disposed in a vacuum;
said sub-image-bearing flux comprises photoelectrons;
said providing, of said image-coherent minified sub-image-bearing flux, is accomplished by transmitting and accelerating said photoelectrons through minifying tapered micro-channel-plate means disposed in said vacuum; and
said electrical-output image sensor modules are sensitive to accelerated photoelectrons.

29. A method for combining the optical imaging resolution of a plurality of electrical-output image sensor modules to resolve a high-resolution two-dimensional optical image, said method comprising the steps of:
receiving said two-dimensional optical image in the form of a plurality of contiguous two-dimensional sub-images and transmitting each said two-dimensional sub-image in image-coherent minified form to a minified two-dimensional sub-image surface; and
providing a plurality of image sensor means for converting an optical image into a corresponding pattern of electrical signals, each said sensor means having a two-dimensional image input surface for receiving a different one of said two-dimensional sub-images at said minified two-dimensional sub-image surface and converting said two-dimensional sub-image into a corresponding pattern of electrical signals.

30. A method of combining the optical imaging resolution of a plurality of electrical-output image sensor modules to resolve a high-resolution optical image, said method comprising the steps of:
converting said optical image to a corresponding image-bearing flux of photoelectrons;
receiving said image-bearing flux of photoelectrons in the form of contiguous sub-image-bearing fluxes and transmitting each said sub-image-bearing flux in image-coherent minified form to a minified sub-image surface; and
providing a plurality of image sensor means for converting an image-bearing flux into a corresponding pattern of electrical signals, each said sensor means having an image input surface for receiving a different one of said sub-image-bearing fluxes at said minified sub-image surface and converting said sub-image-bearing flux into a corresponding pattern of electrical signals.

* * * * *